Nov. 15, 1955 J. RUSTON 2,724,089

CRYSTAL DISCRIMINATOR

Filed Dec. 9, 1949 3 Sheets-Sheet 1

INVENTOR.
JOHN RUSTON
BY Darby & Darby
ATTORNEYS

Nov. 15, 1955 J. RUSTON 2,724,089

CRYSTAL DISCRIMINATOR

Filed Dec. 9, 1949 3 Sheets-Sheet 2

INVENTOR.
JOHN RUSTON
BY Darby & Darby
ATTORNEYS

INVENTOR.
JOHN RUSTON
BY Darby & Darby
ATTORNEYS 2,724,089

CRYSTAL DISCRIMINATOR

John Ruston, Fair Lawn, N. J., assignor to Allen B. Du Mont Laboratories, Inc., Passaic, N. J., a corporation of Delaware Application December 9, 1949, Serial No. 132,136

6 Claims. (Cl. 332—19)

This invention relates to an electrical frequency discriminator and particularly to a discriminator for use in center frequency control circuits.

In discriminators, particularly those used to control the frequency of an oscillator, it is desirable that the discriminator remain tuned to a fixed band of frequencies without drifting during the operating period. Furthermore, it is desirable that the amplitude of the output voltage of the discriminator be essentially a linear function of the input frequency over the operating range, and that the polarity of the output voltage be positive over one half of the band and negative over the other half. The desired stability is obtained by the use of piezoelectric crystal for the tuning element while the symmetry is obtained by rectifying the voltages across elements having complementary frequency responses and adding the rectified voltages.

One object of this invention is to provide an improved discriminator circuit.

A second object is to provide a stable, symmetrical discriminator circuit.

A third object is to provide an improved center frequency control circuit.

Other objects will be apparent from a study of the specification and drawings in which.

Figure 1:
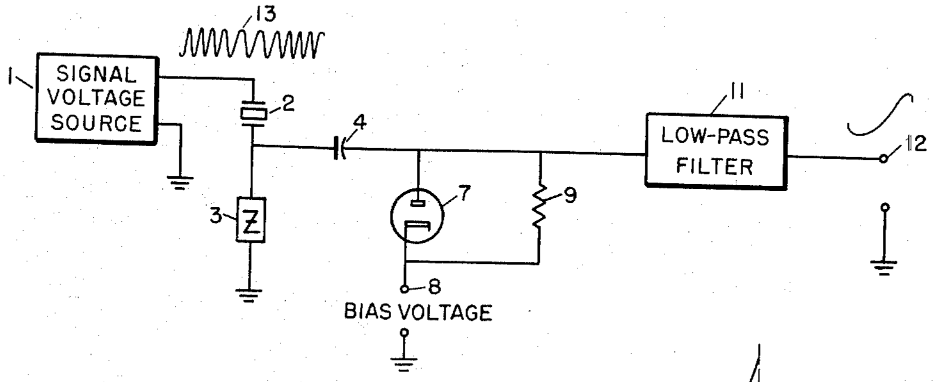
Figure 1 represents one embodiment of this invention.
Figures 3A, 3B:
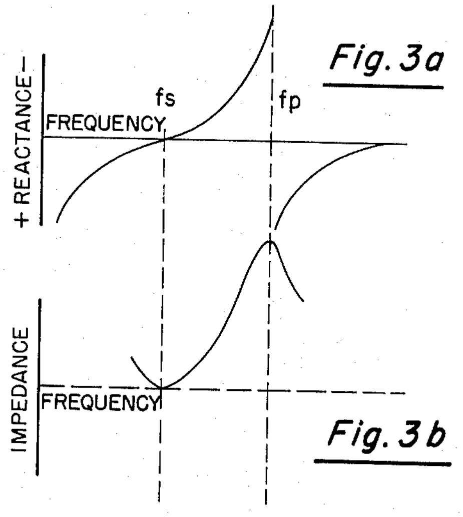
Figure 2:
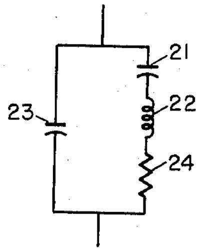
Figure 2 shows the equivalent circuit of the piezoelectric crystal in Figure 1.
Figure 5:
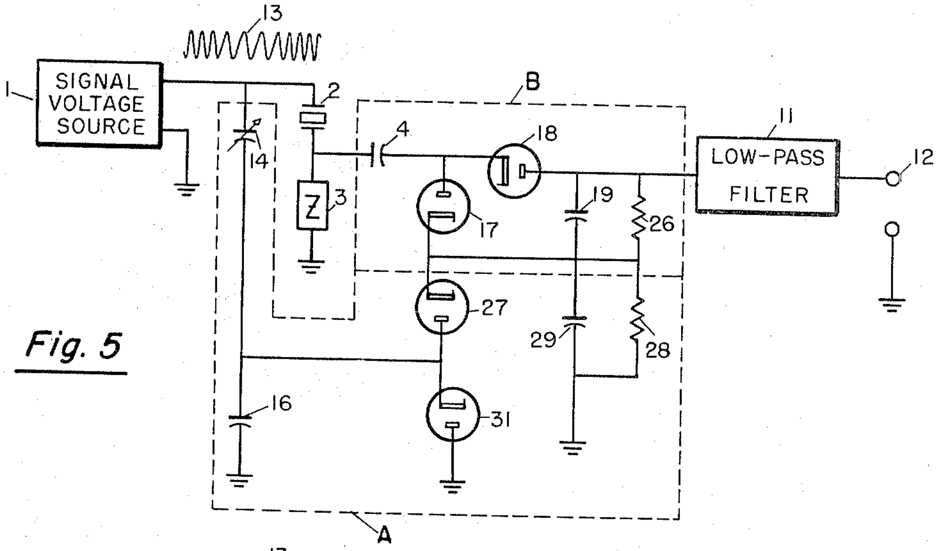
Figure 6:
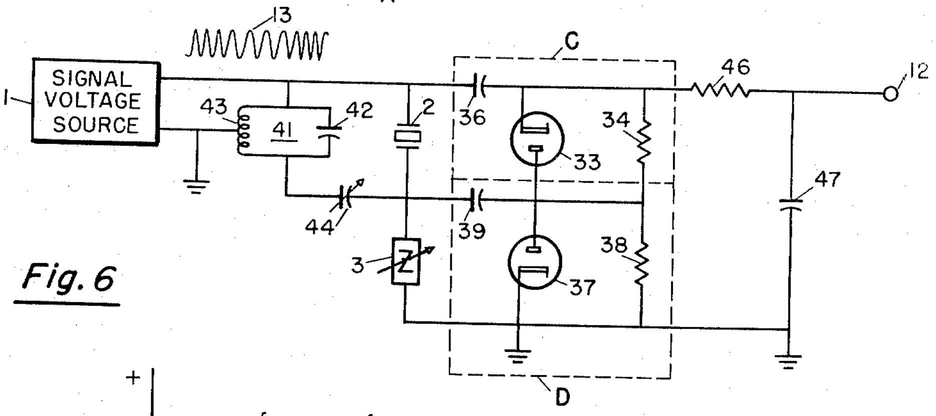
Figures 7A, 7B, 7C:
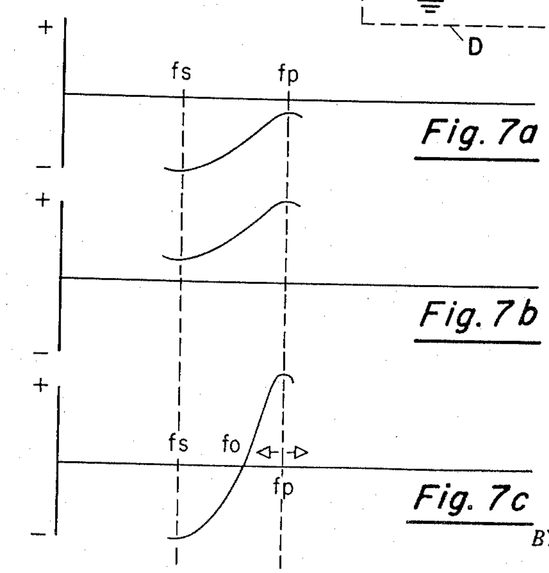
Figure 8:
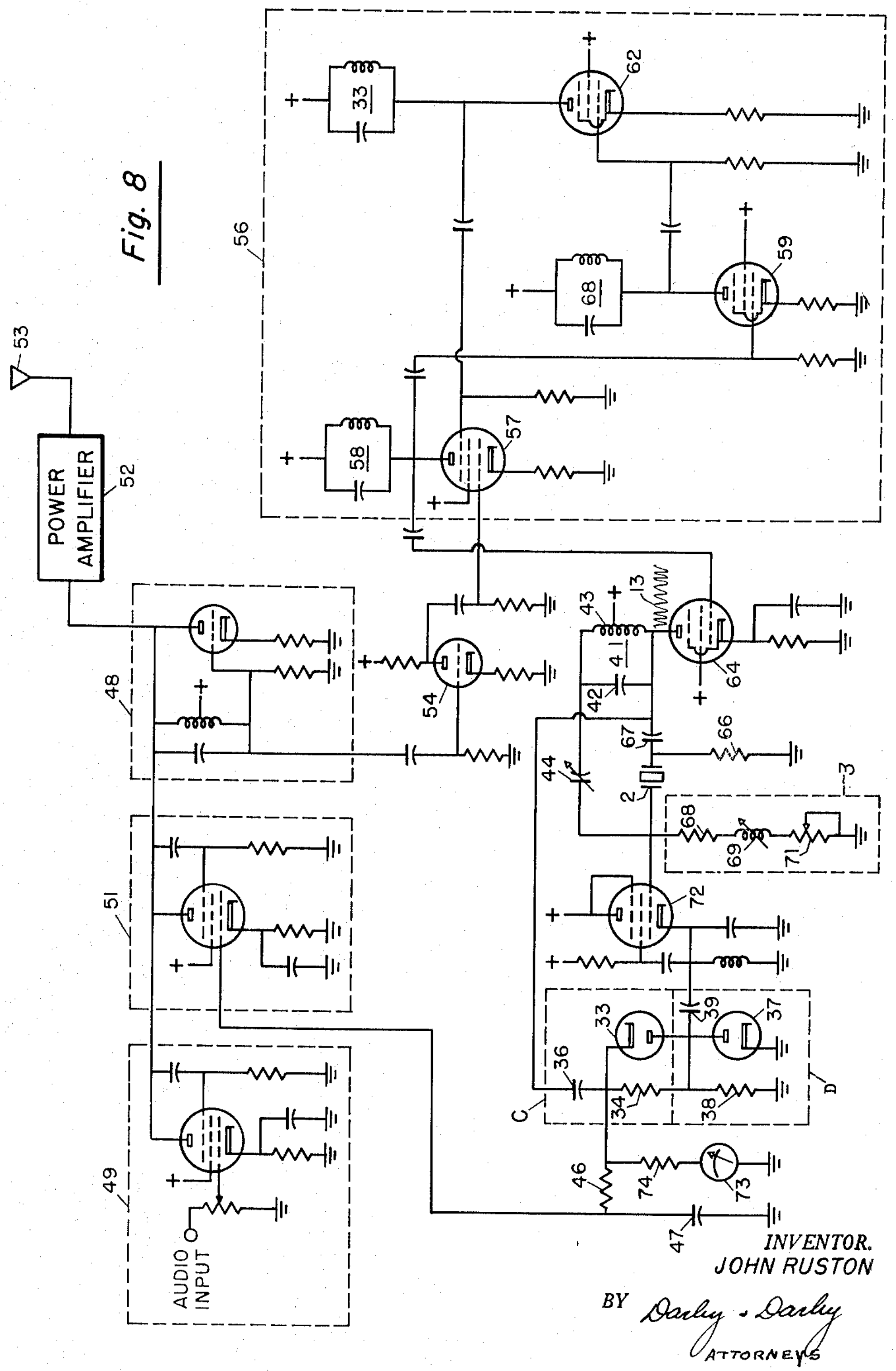

Figures 3*a* and 3*b* illustrate the impedance and reactance variation with frequency of the circuit in Figure 2;

Figures 4*a*, 4*b*, 4*c* and 4*d* represent typical voltage variations at various points in the circuit of Figure 1 under specified conditions;

Figure 5 shows a modification of the circuit in Figure 1;

Figure 6 shows another embodiment of this invention;

Figures 7*a*, 7*b* and 7*c* illustrate voltages appearing at points in the circuit of Figure 6; and Figure 8 shows a center frequency control circuit embodying this invention.

In Figure 1, a source 1 of alternating signal voltage is directly connected to one side of a piezoelectric crystal 2. An impedance 3 forms a series path to ground from the other side of crystal 2. A condenser 4 connects the common junction of crystal 2 and impedance 3 to a detector diode 7 in parallel with a resistor 9. A bias voltage may be connected between terminal 8 and ground for a purpose hereinafter to be explained. Terminal 8 is one of the common connections of diode 7 and resistor 9. A lowpass filter 11 is connected between the junction of condenser 4, diode 7, and resistor 9 and the output terminal 12.

The frequency of the alternating voltage signal of source 1 varies as shown by the wave 13 in Figure 1. In general this frequency variation takes place within a band of frequencies about a fixed frequency although it is not essential that the fixed frequency be in the center of the band.

Crystal 2 may be represented by its equivalent network which is shown in Figure 2. One of the principal advantages of the piezoelectric crystal as a network element is its high Q. The losses in crystal 2 are represented by resistor 24 in Figure 2 which has a comparatively low value.

Since the signal 13 is applied across the series circuit consisting of crystal 2 and impedance 3, the voltage across impedance 3 will be proportional to the ratio of impedance 3 to the impedance of the total series circuits. The impedance 3 is preferably chosen to have a value which is high compared with the crystal impedance at the resonant frequency $f_s$ of crystal 2 and low at the parallel resonant frequency $f_p$. Due to the high Q of the crystal, the magnitude of the crystal impedance is low at $f_s$ and high at $f_p$, so that the value of impedance 3 is not very critical. A resistance of the order of 1200 ohms has proved satisfactory for impedance 3. With a properly chosen impedance 3 substantially the full value of voltage 13 will appear across impedance 3 at $f_s$, while at $f_p$ practically none of voltage 13 will appear across impedance 3.

The voltage appearing across impedance 3 is applied to the rectifier, or D. C. insertion circuit, consisting of condenser 4, diode 7, and resistor 9. As the frequency of voltage 13 changes, the amplitude of signal voltage appearing across impedance 3 is rectified and filtered by the lowpass filter 11 to produce a direct voltage between terminal 12 and ground. The rectifier is connected so that the polarity of terminal 12 is negative with respect to ground and varies with the frequency of voltage 13 in the manner shown in Figure 4*a*. If a bias voltage equal to $V_b$ is subtracted from the output voltage as shown in Figure 4*a*, the result will be that the axis of the output voltage will be shifted to the position of Figure 4*b*.

Figures 4A, 4B, 4C, 4D:
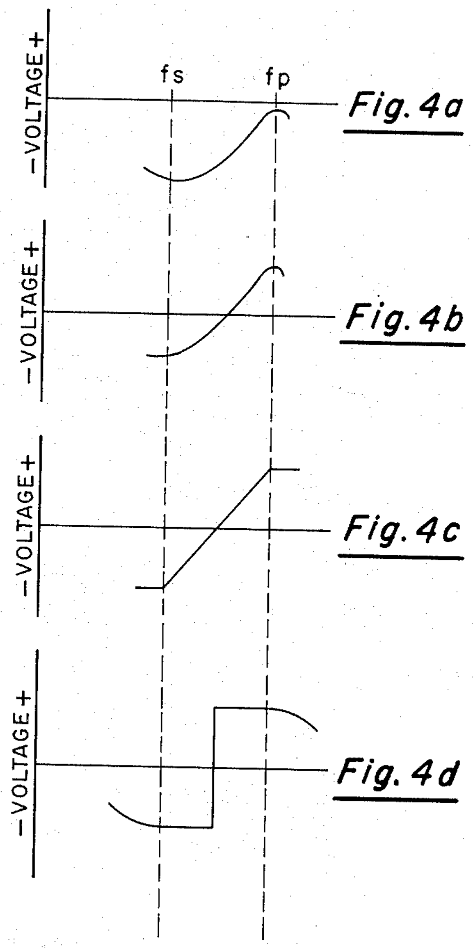

The effect of using a pure resistance for impedance 3 is illustrated in Figures 4*a* and 4*b* while Figures 4*c* and 4*d* show the resultant curve similar to Figure 4*b* using a pure inductance and a pure capacitance respectively. Ordinarily, as shown in Figure 4*d*, the change in the polarity of the output voltage at terminal 12 due to using a pure capacitance for impedance 3 would not be desirable. The output voltage curve due to a pure inductance as shown in Figure 4*c* is quite linear and would be ideal except that a pure inductance is difficult to obtain since there is usually an inherent capacity across the inductance and an inherent resistance in series with the inductance. A pure resistance, at least over the range from $f_s$ to $f_p$, may be obtained by putting a peaking coil in series with the resistor to tune with the inherent capacity and considering the entire network as impedance 3. Outside of the range from $f_s$ to $f_p$, it does not matter if the impedance varies from a pure resistance since positive slope of the output voltage variation extends only between these two frequencies, and the discriminator is normally operated within this band.

As may be expected from Figures 4*b*, 4*c*, and 4*d*, it is necessary for impedance 3 to maintain a consistent reactive and resistive quality over the desired band in order that the amplitude of the output signal may be an approximately linear function of the frequency of the input signal. It is also necessary that the magnitude of impedance 3 remain constant during the operation of the equipment and not change markedly with heat or other normal operating conditions. It is possible through the use of temperature compensated components in impedance 3, to achieve a stability of around 2%, which is sufficient.

A modification of the circuit in Figure 1 is shown in Figure 5 in which the source 1 of input voltage, crystal 2, impedance 3, condenser 4, lowpass filter 11, and output terminal 12 are similar to components in Figure 1 having the same reference numbers. Condensers 14 and 16 form a possible voltage dividing network across the output terminals of source 1 and ground. Two diodes in a voltage doubling circuit are shown in Figure 5. One of these, diode 17, has its plate connected to condenser 4, and the other, diode 18, is connected in series between condenser 4 and lowpass filter 11 with its cathode connected to the former and its plate to the latter. Also connected to the junction of the plate of diode 18 and lowpass filter 11 is one terminal of a parallel circuit consisting of condenser 19 and resistor 26. The other terminal of this parallel circuit is connected to the cathode of diode 17. The cathode of another diode 27 and one terminal of another parallel circuit consisting of resistor 28 and condenser 29 are also connected to the cathode of diode 17. The plate of diode 27 is connected to the junction of condensers 14 and 16. A fourth diode 31 having its plate grounded has its cathode connected to the junction of condensers 14 and 16.

The operation of the circuit in Figure 5 may be most easily explained by first pointing out that diodes 27 and 31 together with resistor 28, condensers 29, 14 and 16 form a voltage doubling rectifier for the signal voltage appearing across condenser 16. This will be referred to as rectifier A. Similarly, diodes 17 and 18 together with condensers 4 and 19 and resistor 26 form a voltage doubling rectifier for the signal voltage appearing across impedance 3. This rectifier will be referred to as rectifier B. Other rectifier circuits such as the plain half-wave rectifier in Figure 1 could be used in place of the voltage doubling circuits if less sensitivity were desired.

In order to obtain the bias voltage applied to terminal 8 in Figure 1, a portion of the input signal voltage 13 is obtained from the junction of condensers 14 and 16 and rectified by rectifier A to produce a direct voltage. The polarity of this direct voltage is such as to make the cathode of diode 27 positive with respect to ground by an amount slightly less than twice the peak voltage across condenser 16.

Rectifier B, acting alone, produces at terminal 12, a voltage similar to the voltage produced by the circuit of Figure 1, but having approximately twice the magnitude. Therefore, Figures 4*a*, 4*b*, 4*c*, and 4*d* apply to Figure 5 if the values of the ordinate are doubled. As shown in Figure 4*a*, it is desirable that the bias voltage $V_b$ have a magnitude equal to approximately half the peak voltage produced at $f_s$. Since rectifier A produces the bias voltage in Figure 5, condensers 14 and 16 should have approximately equal capacities. Any discrepancies may be taken care of by making one of the condensers variable. In this case condenser 14 is chosen. The polarity of the bias voltage $V_b$ is determined by the connections of diodes 27 and 31.

By deriving the bias voltage from the input voltage 13 it is possible to maintain more easily the symmetry of the output voltage about the zero axis as shown in Figure 4*b*. In order that the bias voltage $V_b$ shall have no effect on the shape of the output voltage curve of Figure 4*b*, it is desirable that voltage $V_b$ be essentially independent of frequency, at least over the range from $f_s$ to $f_p$. This is possible if the voltage dividing network does not vary with frequency. A capacity divider such as is shown is one of the simplest of divider circuits and easily meets the requirements of freedom from adverse frequency discrimination.

Another embodiment of this invention is shown in Figure 6, in which the signal voltage source 1, its output voltage 13, the crystal 2 and impedance 3 connected in series across the output terminals of source 1 are the same as before. In Figure 6 a rectifier C comprising a diode 33 and a load resistor 34 are connected to crystal 2 through a condenser 36, and a similar rectifier D comprising a diode 37, a load resistor 38, and a condenser 39 is connected across the impedance 3.

A capacity neutralization circuit comprising a tuned circuit 41 consisting of a condenser 42, in parallel with a center tapped inductance 43 is connected to a pair of output terminals of the signal source 1 by means of the center tap of inductance 43 and one of the terminals of the tuned circuit 41. A neutralizing condenser 44 connects the remaining terminal of the tuned circuit 41 to the junction of crystal 2 and impedance 3. The lowpass filter 11 of Figure 5 is shown in Figure 6 as a resistor 46 connected in series between rectifier C and the output terminal 12 and a shunt condenser 47 between terminal 12 and ground.

The operation of the circuit in Figure 6 is similar to the operation of the circuit in Figure 5 in that the same voltage variation with frequency is produced across crystal 2 and impedance 3 in both circuits. In the circuit of Figure 6 the rectifier C rectifies the voltage across the crystal 2 and the rectifier D rectifies the voltage across the impedance 3. Figure 7*a* shows the rectified voltage across resistor 38, Figure 7*b* shows the rectified voltage across resistor 34, and Figure 7*c* shows the sum of the voltages in Figures 7*a* and 7*b*. The frequency $f_o$ in Figure 7*c* is the frequency at which the voltage across the crystal 2 is equal to the voltage across impedance 3. By varying the magnitude of impedance 3, it is possible to place $f_o$ exactly half way between $f_s$ and $f_p$ thereby making the output voltage curve in Figure 7*c* skew symmetrical about $f_o$.

The series and parallel resonant frequencies, $f_s$ and $f_p$ respectively, of the circuit in Figure 2 are chosen to lie below and above the band of frequencies generated by the signal source 1 in Figure 6. It is possible to grind a piezoelectric crystal to have the correct $f_s$ and $f_p$ but it requires extreme care. The neutralizing circuit shown in Figure 6 is preferred. The output signal 13 of signal source 1 is applied across one-half of the center tapped coil 43. Since coil 43 is part of the resonant circuit 41, an equal voltage of opposite polarity appears across the other half of coil 43. This opposite polarity voltage is connected by the small neutralizing condenser 44 to the lower end of crystal 2. Referring to Figure 2, it is seen that there is a condenser 23 shunting the series circuit consisting of condenser 21, inductance 22 and resistor 24. Condenser 23 tunes with the effective inductive reactance of the series arm of the circuit at the parallel resonant frequency $f_p$. Feeding a voltage of opposite polarity to the bottom terminal of crystal 2 partially neutralizes condensers 23 so that $f_p$ may be adjusted to be closer to $f_s$ or further away than it would if the neutralizing circuit were not used, and this makes it unnecessary to use the highest degree of precision in grinding crystal 2. However, it is obvious that the further $f_p$ is shifted, the more dependent the accuracy will be on the stability of the neutralizing circuit. Consequently it is desirable that the crystal 2 have resonant frequencies reasonably close to the desired frequencies. The resonant frequencies of the crystal 2 need to be accurate to within only .01%, which is still a fairly wide tolerance for piezoelectric crystals.

Figure 8 shows the oscillator, modulator, and center frequency control circuit of a frequnecy modulated transmitter such as the sound transmitter of a television station. The circuit within the dotted lines indicated by reference character 48 is an oscillator of the well known Hartley type and is frequency modulated by the standard reactance tube modulator 49. A second reactance tube modulator 51 is connected in parallel with the first modulator 49. The oscillations of oscillator 48 are amplified by the power amplifier 52 and propagated from the antenna 53. Another amplifier 54 is also connected to the oscillator 48 to act as a buffer stage, receiving the signal from the oscillator 48 and supplying it to a frequency divider 56. The frequency divider 56 comprises a pentode amplifier 57 with its tuned plate load 58, a second amplifier 59 having its input circuit connected to the output of amplifier 57 and having a tuned plate load 61, and a third amplifier tube 62 with a tuned plate load 63 and having signal voltage supplied to its input circuit by amplifier 59 and, in turn, supplying a signal to a second input of amplifier 57.

The output circuit of the tube 57 also supplies a signal to a tube 64 having the previously mentioned tuned circuit 41 as a plate load. The signal voltage 13 appearing at the plate of tube 64 is the same signal voltage 13 referred to in connection with Figures 1, 5 and 6. This signal voltage 13 is applied to the crystal 2 by means of a resistance-capacitance coupling circuit consisting of resistor 66 and condenser 67. Impedance 3 is here shown to be a main resistor 68, an inductance 69, and a variable resistor 71 in the manner explained in connection with Figure 6. In the embodiment shown in Figure 8, the voltage across impedance 3 is passed through a cathode follower buffer amplifier 72 before being applied to a rectifier circuit D. The input condenser 36 of rectifier circuit C is connected to the plate of amplifier tube 64. The sum of the rectified voltages appearing across resistors 34 and 38 is applied through a filter circuit consisting of resistor 46 and condenser 47 to the control grid of the reactance tube modulator 51. A metering circuit consisting of a meter 73 and a resistor 74 is connected across resistors 34 and 38.

In the normal operation of this circuit, the frequency instability of the oscillator 48 which makes it possible to frequency modulate oscillator 48 causes the carrier frequency to drift away from the prescribed center frequency. The oscillations of oscillator 48 are amplified by the buffer stage 54 and applied to the frequency divider 56. The frequency divider is used to divide the operating frequency of oscillator 48 normally used in television transmitters down to the frequency at which piezoelectric crystals for use in crystal 3 may be made most stable. In a television transmitter operating on channel 2 (54–60 mc.), oscillator 48 preferably is tuned to a frequency of 1.24476 mc. and multiplied by a factor of 48 in the amplifier 52 in order to transmit on a frequency of 59.750 mc., the sound frequency of channel 2. Tuning the oscillator 48 to a frequency of 1.24476 mc. makes it necessary to divide by 5 in order that the crystal 2 may be cut to resonate at a frequency of 248.958 kc.

The load 58 of amplifier 57 is tuned to the desired operating frequency of crystal 2. A voltage of this frequency is then applied to the input of amplifier 59 acting as a doubler. The tuned trap 60 resonates at twice the frequency of the trap 58 and this double frequency oscillation is passed on to the amplifier 62 which acts as a second doubler and has its load 63 tuned to four times the frequency of tuned circuit 58. The output voltage of amplifier 62, having a frequency ⅘ the frequency of oscillator 48, is applied to a second input of tube 57 and is mixed within the tube with the signal voltage having the frequency of oscillator 48. Thus a complex wave having components including one at the frequency of oscillator 48, one at fourth-fifths of said frequency, and one at one-fifth of said frequency appears at the plate of tube 57. Since the load 58 is tuned to the last named frequency, it is the only one applied to the input circuits of tubes 59 and 64. The frequency divider 56 is preferred to other types of frequency dividers because of its stability.

The voltage applied to the control grid of tube 64 is amplified and appears at the plate as signal voltage 13. From this point on the circuit operates as the circuit in Figure 6. Since the center tap of inductance 43 is connected to B+ instead of to ground, it is necessary to use the blocking condenser 6 to block the D. C. plate voltage from crystal 2. Instead of connecting impedance 3 directly to its rectifier D, in this instance a cathode follower buffer stage is preferred to prevent the non-linear impedance of the rectifier circuit from reacting on impedance 3.

If the oscillator 48 deviates from the proper frequency in normal operation, a voltage exists between the cathode of diode 33 and ground, and the polarity of this voltage depends on whether the frequency of oscillator 48 is higher or lower than normal. This voltage is filtered by resistor 46 and condenser 47 and applied to the control grid of the reactance tube modulator 51. Thus when the carrier frequency drifts, the voltage applied to the grid of the modulator 51 returns the frequency to the proper value.

From the foregoing description it will be apparent that modifications within the spirit of the invention may be made, the scope thereof being defined by the appended claims.

What is claimed is:

1. A frequency discriminator comprising a source of variable frequency signal voltage, a series circuit connected across said signal source, said series circuit consisting of a piezoelectric crystal as one component and an impedance as a second component, each of said components having a portion of the signal voltage thereacross, a rectifier circuit coupled effectively in parallel with each of said components to rectify the voltages thereacross, and a combining circuit for adding the resultant rectified voltages.

2. A frequency discriminator comprising a source of variable frequency signal voltage, a series circuit connected across said signal source, said series circuit consisting of a piezoelectric crystal as one component and an impedance as a second component, each of said components having a portion of the signal voltage thereacross, a first rectifier across one of said components to rectify the signal voltage thereacross, a second rectifier across the other of said components to rectify the signal voltage thereacross, and a combining circuit for adding the resultant rectified voltages in opposite voltage polarity.

3. A frequency discriminator comprising a source of signal voltage, said signal voltage having a frequency which varies throughout a band of frequencies about a predetermined frequency, a series circuit across said signal source, said series circuit consisting of two components one of which is a piezoelectric crystal and the other of which is an adjustable impedance, each of said components having a portion of the signal voltage thereacross, a first rectifier connected to one of said components to rectify the signal voltage appearing thereacross, a second rectifier connected to the other of said components to rectify the signal voltage thereacross, a combining circuit for adding the rectified voltage from said first rectifier and the rectified voltage from said second rectifier in opposite voltage polarity to produce a resultant voltage which is negative when the frequency of said signal voltage is at one end of said frequency band and positive when the frequency is at the other end of said band and zero at a frequency intermediate the ends of said band, and means for varying the frequency at which said resultant voltage is zero, said means including said variable impedance.

4. In an automatic frequency control circuit a frequency discriminator comprising a piezoelectric crystal having an equivalent electrical network consisting of a series circuit comprising a condenser, an inductance, and a resistor, said series circuit having a series resonant frequency, said series circuit being in parallel with a second condenser, said parallel circuit having a parallel resonant frequency, an impedance in series with said crystal, a variable frequency signal source having a pair of output terminals, said serially connected impedance and crystal being connected between said pair of output terminals, means to vary said parallel resonant frequency, said means comprising a tapped inductance having one end connected to one of said output terminals and the tap connected to the other of said output terminals and the other end connected by means of a condenser to the junction of said impedance and said crystal, a rectifier circuit connected to said impedance to rectify the voltage thereacross, a second rectifier circuit connected to said crystal to rectify the voltage thereacross, a combining circuit to combine the resultant rectified voltages.

5. In a center frequency control circuit a frequency discriminator comprising a piezoelectric crystal having an equivalent circuit consisting of a series circuit resonant at a predetermined frequency and a parallel circuit consisting of said series circuit in parallel with a condenser, said parallel circuit being resonant at a different frequency, an impedance serially connected with said crystal to form a second series circuit, a variable frequency signal voltage source having a pair of output terminals across which said second series circuit is connected, an amplifier having an input connected to said impedance to amplify the voltage thereacross and an output circuit, a rectifier to rectify the voltage at said output circuit, a second rectifier circuit to rectify the difference voltage between the output voltage of said signal source and the output voltage of said amplifier, a combining circuit to combine the resultant rectified voltages, and means for varying the frequency at which said parallel circuit is resonant, said means comprising a tapped inductance having two ends, one of said ends being connected to one of said output terminals and the tap being connected to the other of said terminals, and the other end being connected to the junction of said impedance and said crystal.

6. The apparatus of claim 1 in which the value of said impedance is equal to that of said crystal at the center frequency of operation of said discriminator.

References Cited in the file of this patent

UNITED STATES PATENTS

| | | |
|---|---|---|
| 2,085,008 | Crosby | June 29, 1937 |
| 2,360,764 | Crosby | Oct. 17, 1944 |
| 2,397,840 | Crosby | Apr. 2, 1946 |
| 2,461,956 | Beckwith | Feb. 15, 1949 |
| 2,495,776 | Royden | Jan. 31, 1950 |